United States Patent [19]
Berner

[11] Patent Number: 6,076,459
[45] Date of Patent: Jun. 20, 2000

[54] METHOD AND APPARATUS FOR THE PRODUCTION OF A PRINTING STENCIL

[75] Inventor: Peter Berner, Rupperswil, Switzerland

[73] Assignee: Fingraf AG, Zug, Switzerland

[21] Appl. No.: 08/989,348

[22] Filed: Dec. 12, 1997

Related U.S. Application Data

[63] Continuation-in-part of application No. 08/591,695, Jan. 25, 1996, abandoned.

[30]      Foreign Application Priority Data

Jan. 26, 1995 [CH]  Switzerland ................. 213/95

[51] Int. Cl.$^7$ ........................................ B41F 15/08
[52] U.S. Cl. ............................................. 101/128.4
[58] Field of Search ........................ 101/128.21, 128.4, 101/216, 401.1; 118/301, 406; 427/282; 430/308; 347/2, 99, 102

[56]           References Cited

U.S. PATENT DOCUMENTS

| | | | |
|---|---|---|---|
| 3,789,757 | 2/1974 | Motter et al. | 101/216 |
| 4,484,948 | 11/1984 | Merritt et al. | 347/99 |
| 4,833,486 | 5/1989 | Zerillo | 347/99 |
| 5,147,762 | 9/1992 | Verheesen et al. | 101/128.4 |
| 5,156,089 | 10/1992 | McCue et al. | 101/128.4 |
| 5,189,951 | 3/1993 | Webster et al. | 101/128.21 |
| 5,247,315 | 9/1993 | Phelan et al. | 347/2 |
| 5,384,007 | 1/1995 | Fischer | 101/128.4 |
| 5,495,803 | 3/1996 | Gerber et al. | 101/401.1 |
| 5,511,477 | 4/1996 | Adler et al. | 101/401.1 |
| 5,514,209 | 5/1996 | Larson, Jr. | 347/99 |
| 5,580,698 | 12/1996 | Andersen | 101/128.21 |
| 5,662,821 | 9/1997 | Ruckl | 101/128.4 |

FOREIGN PATENT DOCUMENTS

| | | |
|---|---|---|
| 0 492 351 | 7/1992 | European Pat. Off. |
| 0 558 098 | 9/1993 | European Pat. Off. |
| 0 590 164 | 4/1994 | European Pat. Off. |
| 132767 | 7/1985 | Japan ............... 347/102 |
| 109052 | 5/1988 | Japan ............... 101/463.1 |

*Primary Examiner*—Stephen R. Funk
*Attorney, Agent, or Firm*—Collen Law Associates, P.C.

[57]            ABSTRACT

For the production of a printing stencil, a fine-mesh screen is provided with an unexposed photoemulsion layer and aligned in order to establish it in an essentially tubular or flat shape On the photoemulsion layer, those locations which are not to be exposed are covered with an opaque layer according to a particular pattern. The opaque coating layer—together with the non-exposed portions of the photoemulsion layer—is removed after the exposure of the non-covered locations of the latter. The opaque coating material contains wax and preferably is soluble in water. To avoid a perceptible starting line in the case of a tubular screen, the pattern start is varied according to any law, preferably following a sine line, in order to avoid a clear-cut separating line.

6 Claims, 2 Drawing Sheets

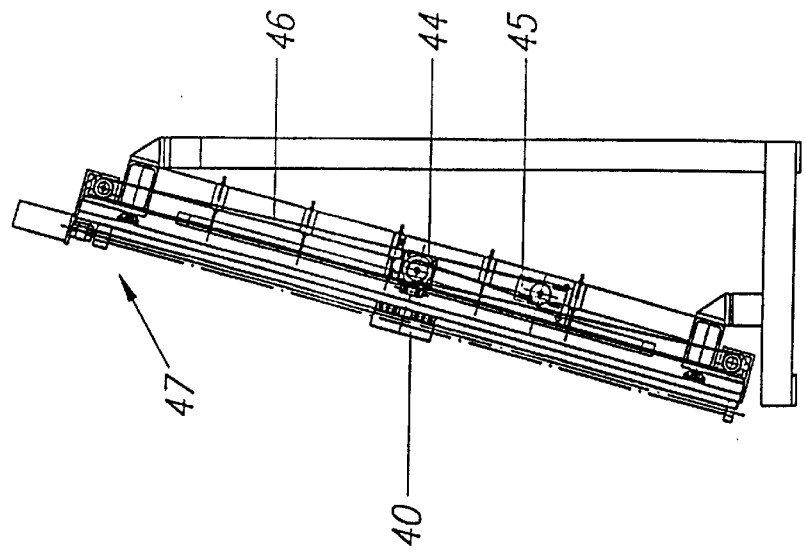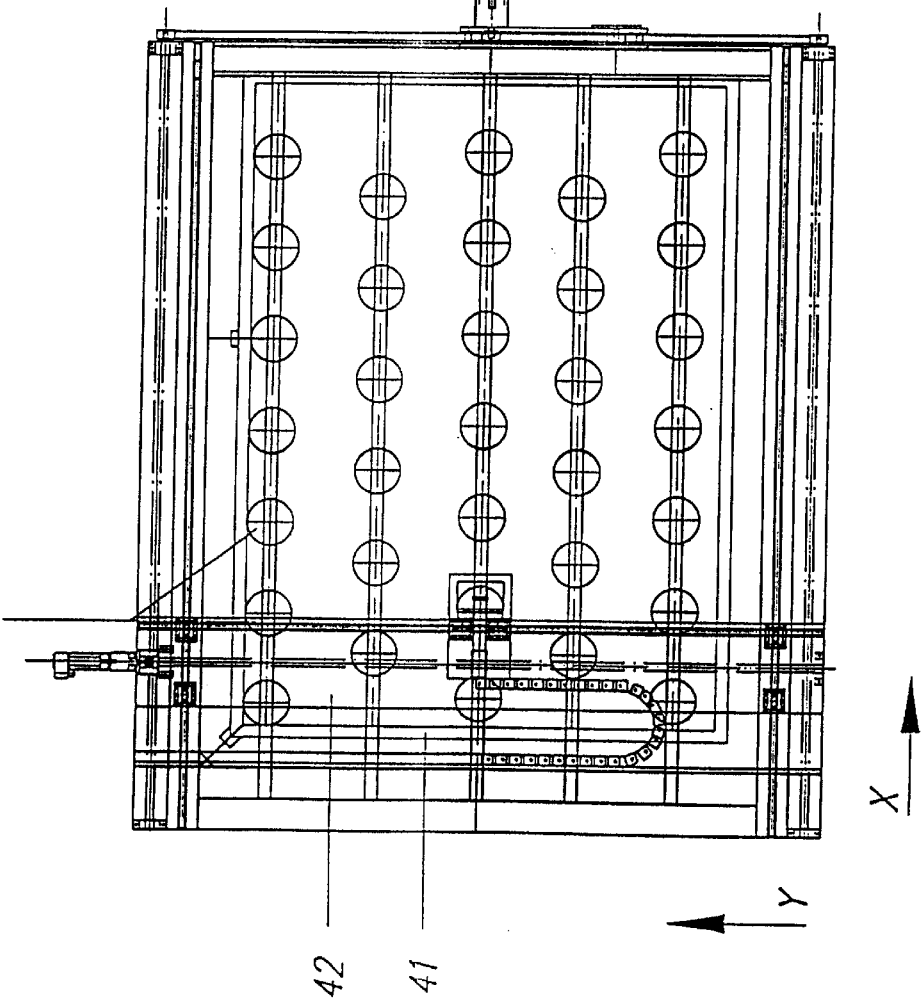

METHOD AND APPARATUS FOR THE PRODUCTION OF A PRINTING STENCIL

CROSS-REFERENCE TO RELATED APPLICATION

This application is a continuation-in-part of Ser. No. 08/591,695, filed Jan. 25, 1996, now abandoned.

FIELD OF THE INVENTION

The present invention relates to a method and apparatus for the production of a printing stencil by means of a fine-mesh screen which is provided with an unexposed photoemulsion layer and on which those locations which are not to be exposed are covered with an opaque layer according to a particular pattern, wherein the said layer contains wax and being removed after exposure.

BACKGROUND OF THE INVENTION

Printing stencils coated in this way are known, as shown by EP-A-0,492,351, EP-A-0,558,098 or EP-A-0,590,164. Considered individually, in EP-A-0,492,351 a method and a corresponding apparatus for the production of a printing stencil of this kind is proposed. There, preferably a powder, such as for example talcum powder, is applied to the screen, so that the ink sprayed on thereafter does not run, but forms exact contours. A disadvantage of this arrangement may be seen in the use of this powder which always forms a mist at the workplace and which is therefore detrimental to the environment EP-A-0,558,098 describes the design of tailstocks which are provided with steps so that tubular screens having different diameters can be centered. The production of such tailstocks is relatively complicated and therefore costly, since, in comparison with simple known tailstocks, merely exchanging these would clearly make the extra cost a major factor.

Finally, EP-A-0,590,164 shows a method, in which the covering layer is formed from a high-viscosity layer. An emulsion of a synthetic resin lacquer is proposed as a material for this high-viscosity layer. However, such a material has a high adhesive force on the screen, and there is no provision for washing out after exposure, since the covering fluid is to be resistant to abrasion and to chemical influences of the printing chemicals.

SUMMARY AND OBJECTS OF THE INVENTION

An object of the invention is, therefore, to specify a method or an apparatus respectively by which an easily removable covering layer can be applied to a screen according to a particular patterns and the screen can be coated as a tube or as a plane surface.

In the invention, this is where the method for the production of a printing stencil is characterized by the following steps:

providing a fine-mesh screen which is covered with an unexposed photoemulsion layer;

aligning said screen in order to establish it in an essentially tubular or flat shape;

providing an opaque coating material that contains wax;

providing a spray head for the application of a covering layer of said opaque coating material to the surface of said photoemulsion layer on said screen;

covering those locations of said photoemulsion layer which are not to be exposed to an exposure light with said covering layer by spraying a number of adjacently arranged cover strips, according to a predetermined pattern;

removing the wax containing covering layer and the non-exposed part of the photoemulsion layer after exposure to light.

Preferred embodiments of the method according to the invention—if applied to tube-like or cylindrical screens—comprise the adjustment of the setting of the coater relative to the origin of circumferential cover strips which are sprayed adjacently to one another and which define the pattern. Advantageously, this adjustment can take place with a sine function about the origin. Also preferred embodiments comprise—if applied to tubular or flat screens—a light emitter which can also be mounted on the coater, so that the exposure of the locations not covered by the opaque, wax containing covering layer can take place in the same operation.

In the invention, this is achieved further where the apparatus for carrying out the method,—in the case of a tubular or flat screen arrangement—is characterized in that the coater comprises a spray head for the application of an opaque, wax containing covering layer onto the photoemulsion layer in the form of cover strips. Another embodiment for coating a tubular screen is characterized by a number of retractable stays, each with a recess in the form of a segment of a circle, for initially aligning the tubular screen with the tailstocks of an arrangement for rotating the screen about its longitudinal axis. Furthermore, an apparatus for carrying out the method—for a screen arranged flat—is characterized in that the screen rests on a number of stays which are arranged in rows and columns and which also bring about the alignment of the frame of the screen in the two main X and Y directions.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

FIG. 1 shows an elevation of an apparatus for coating a cylindrical or rotary screen, with means for centering and clamping the latter on;

FIG. 4 shows a side view of an apparatus for coating a plane screen, and

FIG. 5 shows a front view of the mounting of the clamping frame of the screen,

DETAILED DESCRIPTION OF PREFERRED EMBODIMENT

Figure 2:
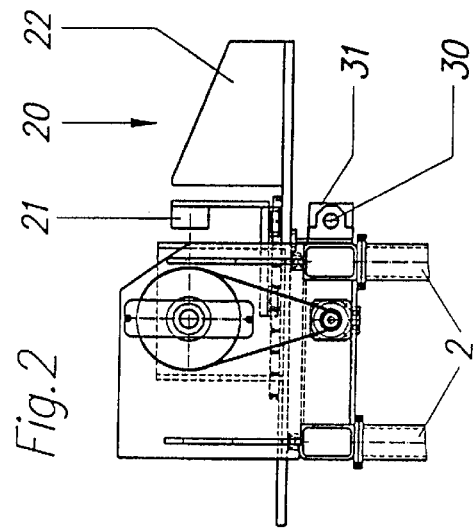
FIG. 2 shows a side view, as seen from the left in FIG. 1.
Figure 3:
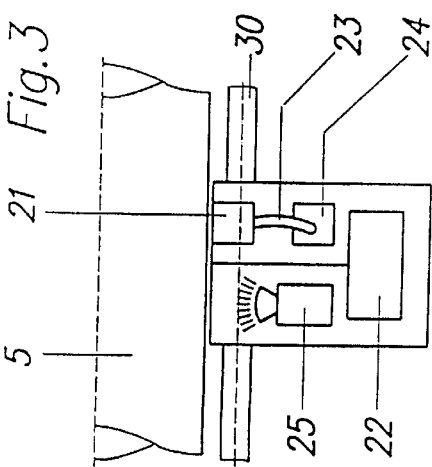
FIG. 3 shows a top view of the slide with the spray nozzle arrangement and with the associated control means.
Figure 1:
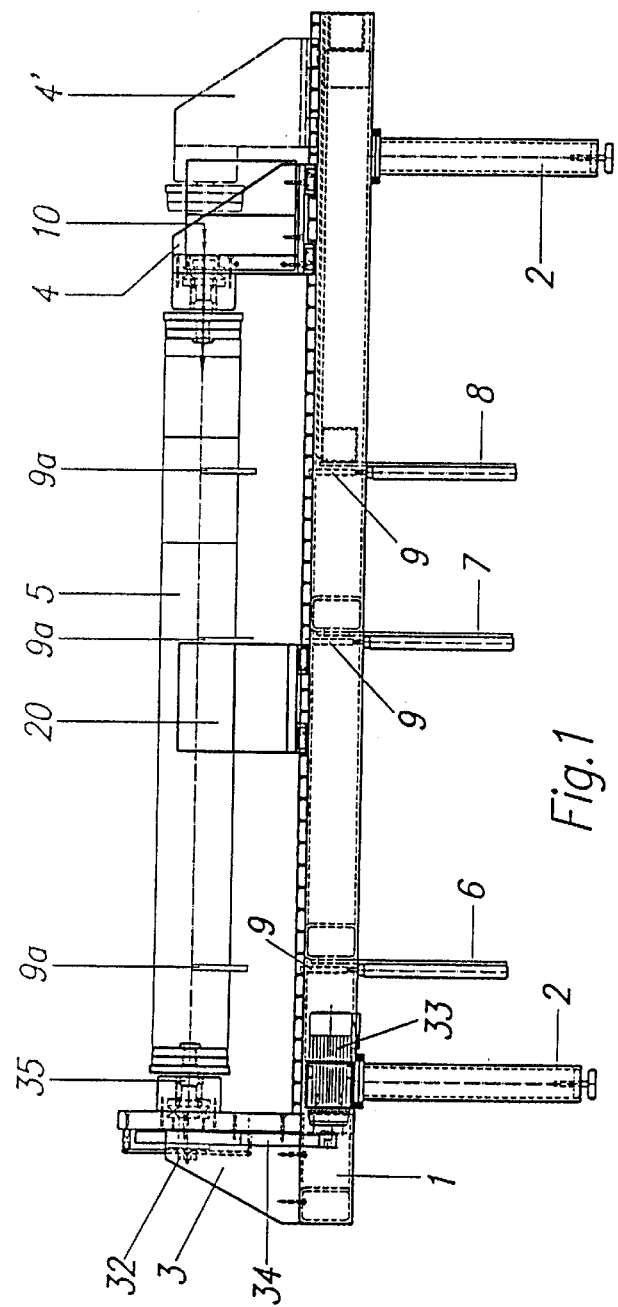

The arrangement for coating a cylindrical screen according to FIGS. 1, 2 and 3 shows a stand 1 on stays 2, two of which can be seen in FIG. 1. Two tailstocks 3, 4 serve in a known way for centering and clamping the cylindrical screen 5 and for rotating it by means of a motor 33 and a toothed belt 34 acting onto the spindle 35 in the tailstock 3. The tailstock 4 is arranged axially displaceable as shown by the position of the tailstock 4' being represented by broken lines. By displacing tailstock 4 into the position of tailstock 4', the cylindrical or tubular screen 5 can be inserted into or taken from the coating apparatus unimpededly from above or from the front.

On inserting a rotary screen 5, for example three vertically adjustable stays 6, 7, 8 serve as an insertion aid. Each stay 6, 7, 8 has a bearing plate 9 provided with a recess in the form of a segment of a circle which preferably has essentially the radius of the rotary screen 5. These stays 6, 7, 8 are raised mechanically or pneumatically, so that the bearing plates come into the position 9a and thus form a bed for the screen 5 and thereby initially center the latter. By moving the tailstock 4' into the holding position of tail-stock 4, the screen 5 is finally centered and air is blown by means of a blower 10 into the screen, so that the latter assumes the correct circular-cylindrical shape. Said stays 6, 7, 8 can be lowered after inflation and stabilization of the rotary or tubular screen with air. The stays have no particular function in their retracted, that is lowered, position, as they are not necessary for further alignment or stabilization of the rotary screen during the coating process.

After coating and—if appropriate—after also exposing the coated screen 5, the stays 6, 7, 8 may be raised again in order to facilitate the careful releasing of the screen which then is taken out from the coating apparatus for further processing according to known methods.

The coater 20 can be seen in FIGS. 2 and 3. In the present case it consists of a spray head 21 which preferably can have up to 96 or more nozzles. Advantageously the nozzles are arranged linearly at an acute angle to the base of the coater. Moreover, a control 22 together with a data transmitter is located on the coater 20, by means of which data transmitter the individual nozzles of the spray head 21 are controlled, that is to say i.e. closed or opened. Of course, there is also located on the coater 20 a reservoir 24 for containing the coating material. In the preferred embodiment of the method according to the invention, the coating material contains wax and is heated in the reservoir 24 to a temperature which is well above the respective melting point. If appropriate, the coating material is mixed with glue. By means of a thermally insulated conduit 23, the liquefied coating material is delivered to the spray head 21. The spray head can be heated too, so the temperature of the coating material may be kept always above its melting point. Thus the coating material cannot block lines or nozzles by mere solidification.

Coating with a spray head 21 having for example 96 nozzles, preferably takes place in cover strips of a width of approximately 8 mm. Of course, the resolution of a covering layer according to a predetermined pattern depends on the number of spraying nozzles per certain width of such a cover strip as well as on the dot size achievable A drive with a stepping mechanism can thus be advanced by 8 mm in each case after coating a single cover strip in case of coating a rotary screen The starting point for a revolution 30 is determined by a position transmitter 32.

A light emitter 25 can also be mounted on the coater 20, so that, in principle, the exposure of the locations not covered or masked by the wax can take place in the same operation. This means on the one hand that—while spraying a cover strip and during the same rotation of the screen— with the light emitter 25 placed downstream of the coater 20 as viewed in direction of rotating the tubular screen 5, the unmasked portions of the photoemulsion layer situated within the area of the strip being actually coated, can be exposed. On the other hand—no matter whether the light emitter is placed upstream or downstream of the coater 20, the unmasked portions of the photoemulsion layer laying within the area of a cover strip which was coated during a previous rotation can be exposed The advance of the coater is carried out by means of a spindle 30 and by means of a ballscrew nut 31 and consequently in a very even form.

It can easily be seen that a coating, which always has its origin at the same location on the circumference of the cylindrical screen, can produce a line in the pattern. In order to eliminate this, the angle transmitter 32 necessary for the control is utilized in order to adjust the setting of the coater 40 relative to the origin of the pattern in any way. Advantageously, this adjustment can take place with a sine function about the origin. Consequently, the respective start for a revolution of the screen and consequently also the start position of the cover strips being situated adjacently to one another is varied or displaced forwards or backwards, according to any law, and no perceptible interruption in the pattern can occur.

The coater 40 is also moved in a similar way over the flat screen (see FIGS. 4 and 5). One difference is that, here, the coater 40 is moved in two orthogonal directions and the screen rests on a number of stays or heads 43 which are arranged in rows and columns The stays 43 schematically indicated in FIG. 5 as circles can also have any other shape deviating from being round. Some of the stays or heads 43 are built and arranged such that they also bring about the alignment of the frame of the screen in the two main X- and Y- directions, so they serve for the correct mounting of the plane or flat screen 42 clamped in a frame 41. The frame 41 bears in two orthogonal directions against supporting heads 43, which thus has an exactly fixable position. The screen 42 rests on further supporting heads 43 at a plurality of locations and can thereby withstand the slight pressure of the coater 40. A motor 44 serves for the drive in the Y-direction (see FIG. 5) and displaces a slide 47 together with the coater 40 in steps via a drive band 46 tensioned by means of clamping elements 45. The coater 40 is then moved to and fro in the X-direction evenly by drive means known per se. Of course, depending on the orientation of the nozzle array, the coater could apply the cover strips either in the X or Y direction. A two-way coating (preferably +Y/−Y . . . ) is preferred as only the quick advance steps in the X direction, each in the size of the width of one cover strip have to be carried out without being productive However, it may be found advantageous to spray the screen in only one direction (e.g. +Y/+Y . . . ) if it is remembered that the respective coating width of 8 mm by means of the 96 nozzles must be advanced with a relatively small speed and the coater 40 returned to the zero position—in a quick step—prior to the subsequent, relatively slow coating movement; so for exposing of the previously coated cover strip, with the light emitter 25 coupled to the coater 40, the same momentarily condition of the area to be exposed can be assumed.

The problem associated with the use of a coating material according to prior art, which is only solubilized with a solvent, is the blocking of the nozzles with solidified coating material particles that is to be expected frequently. In such cases careful and time consuming cleaning of the spray head, which even may comprise hundreds of nozzles, is necessary. It is therfore a particular advantage of the method and apparatus according to the invention to use a coating material with a high content of wax. Just by heating, the coating material is solubilized not only in the reservoir 24 but also in the nozzles of the coater 20. Thus blocking of nozzles basically cannot occur any more. A further advantage of the method and apparatus of the present invention is the use of a coating material—even one with a high wax content—that is water soluble. Thus washing the coated and exposed screen is greatly facilitated by the use of water. If recycling of the washing water is performed, the step of removing the wax containing covering layer and the non-exposed part of the photoemulsion layer after exposure to light is turned into a method which is safe for the environment.

While specific embodiments of the invention have been shown and described in detail to illustrate the application of the principles of the invention, it will be understood that the invention may be embodied otherwise without departing from such principles.

What is claimed is:

1. A method for the production of a cylindrical, tubular printing stencil, which comprises providing a fine mesh screen having a cylindrical, tubular shape with an unexposed photoemulsion layer;

providing an opaque, wax containing material, covering those locations on said unexposed photoemulsion layer which are not to be exposed with an opaque covering layer according to a particular pattern;

using a spray head to apply said opaque, wax containing covering material to said photoemulsion layer in order to form said covering layer;

applying said covering layer in covering layer strips;

varying the respective starts of said covering layer strips for one revolution of said tubular screen in order to avoid clear-cut interruption in said pattern; and removing said covering layer after exposure.

2. A method according to claim 1, in which the starts of said covering layer strips are varied to follow a sine line.

3. A method according to claim 1, in which locations on said unexposed photoemulsion layer that are not covered by said opaque, wax containing covering layer are exposed, subsequent to the coating, in the same operation.

4. An apparatus for the production of a cylindrical, tubular printing stencil comprising:

a plurality of tailstocks for rotating a tubular, cylindrical screen with an unexposed photemulsion layer about a longitudinal axis;

means for providing an opaque, wax containing covering material;

a spray head for covering any locations on said unexposed photoemulsion layer which are not to be exposed, in order to form a covering layer in a plurality of covering layer strips according to a particular pattern; and means for varying any of the respective starts of said covering layer strips for one revolution of said tubular screen, in order to avoid a clear-cut interruption in said pattern.

5. An apparatus according to claim 4, wherein at least one tailstock is designed with a feed of compressed air into a cylindrical cavity of said tubular screen.

6. An apparatus according to claim 5, comprising a plurality of stays for aligning said tubular screen, each stay containing a bearing plate with a plurality of recesses in the form of a circle, in order to aid in insertion of said tubular screen.

* * * * *